United States Patent
Ngo et al.

(10) Patent No.: US 7,372,305 B1
(45) Date of Patent: May 13, 2008

(54) SCANNABLE DYNAMIC LOGIC LATCH CIRCUIT

(75) Inventors: Hung C. Ngo, Austin, TX (US); Jente B. Kuang, Austin, TX (US); James D. Warnock, Somers, NY (US); Dieter F. Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/554,685

(22) Filed: Oct. 31, 2006

(51) Int. Cl.
*H03K 19/096* (2006.01)

(52) U.S. Cl. .............................. 326/98; 326/93; 326/95

(58) Field of Classification Search .................. 326/93, 326/95–98, 112, 119, 121–122
See application file for complete search history.

(56) References Cited

U.S. PATENT DOCUMENTS

| | | | | |
|---|---|---|---|---|
| 5,831,990 | A * | 11/1998 | Queen et al. ................ | 714/724 |
| 5,870,411 | A * | 2/1999 | Durham et al. ............. | 714/724 |
| 6,172,531 | B1 * | 1/2001 | Aipperspach et al. ....... | 326/108 |
| 6,570,407 | B1 * | 5/2003 | Sugisawa et al. ............ | 326/93 |
| 6,650,145 | B2 | 11/2003 | Ngo et al. .................... | 326/98 |
| 6,690,204 | B1 * | 2/2004 | Belluomini et al. .......... | 326/95 |
| 6,744,282 | B1 | 6/2004 | Dhong et al. ................. | 326/93 |
| 6,914,453 | B2 * | 7/2005 | Dhong et al. ................. | 326/98 |
| 6,952,118 | B2 * | 10/2005 | Jamshidi et al. .............. | 326/98 |
| 7,034,578 | B2 * | 4/2006 | Bertram et al. ............. | 326/121 |
| 7,161,390 | B2 * | 1/2007 | Aipperspach et al. ....... | 326/121 |
| 7,170,328 | B2 * | 1/2007 | Dhong et al. ................ | 327/202 |
| 7,212,039 | B2 * | 5/2007 | Qureshi et al. ............... | 326/98 |

OTHER PUBLICATIONS

Pham D., et al., "The Design and Implementation of a First-Generation Cell Processor," ISSCC 2005, pp. 184-185.

* cited by examiner

*Primary Examiner*—Rexford Barnie
*Assistant Examiner*—Christopher Lo
(74) *Attorney, Agent, or Firm*—Winstead PC; Casimer K. Salys

(57) ABSTRACT

A scannable latch incorporates a logic front end that has at least one dynamic logic gate that has a logic tree that perform the normal Boolean logic operation. The dynamic logic gate is combined a scan pull-down logic tree that is coupled to a scan hold latch output and to the dynamic node of the dynamic logic gate. A scan clock and a normal clock determine whether the logic circuitry is in the normal logic mode or in the scan test mode. A static output latch has at least one input that is responsive logic state of a dynamic node. The evaluated state of the dynamic node is set by either the logic tree of the dynamic logic gate or the scan pull-down logic tree of the scan circuitry in response to the logic state of the scan clock or the normal clock.

20 Claims, 10 Drawing Sheets

SCANNABLE DYNAMIC LOGIC LATCH CIRCUIT

TECHNICAL FIELD

The present invention relates to latch circuits and in particular to latch circuits used in conjunction with level sensitive scan design (LSSD) and general scan design (GSD) methodologies.

BACKGROUND INFORMATION

Modern data processing systems may perform Boolean operations on a set of signals using dynamic logic circuits. Dynamic logic circuits are clocked. During the precharge phase of the clock, the circuit is preconditioned, typically, by precharging an internal node (dynamic node) of the circuit by coupling to a power supply rail. During an evaluate phase of the clock, the Boolean function being implemented by the logic circuit is evaluated in response to the set of input signal values appearing on the inputs during the evaluate phase. (For the purposes herein, it suffices to assume that the input signals have settled to their "steady-state" values for the current clock cycle, recognizing that the input value may change from clock cycle to clock cycle.) Such dynamic logic may have advantages in both speed and the area consumed on the chip over static logic. However, the switching of the output node with the toggling of the phase of the clock each cycle may consume power even when the logical value of the output is otherwise unchanged.

This may be appreciated by referring to FIG. 1A illustrating an exemplary three-input OR dynamic logic gate and the accompanying timing diagram, FIG. 1B. This type of logic gate is referred to in the literature as a Domino logic gates since state changes ripple through cascaded circuits when the clock signal evaluates the dynamic node like "Dominos" falling.

Dynamic logic 100, FIG. 1A, includes three inputs a, b and c coupled to a corresponding gate of NFETs 102a-102c. During an evaluate phase of clock 104, $N_1$, NFET 106 is active, and if any of inputs a, b or c are active, dynamic node 108 is pulled low, and the output OUT goes "high" via inverter 110. Thus, referring to FIG. 1B, which is illustrative, at $t_1$ input a goes high during a precharge phase $N_2$ of clock 104. During the precharge phase $N_2$ of clock 104, dynamic node 108 is precharged via PFET 112. Half-latch PFET 114 maintains the charge on dynamic node 108 through the evaluate phase, unless one or more of inputs a, b or c is asserted. In the illustrative timing diagrams in FIG. 1B, input a is "high" having a time interval $t_1$ through $t_2$ that spans approximately 2½ cycles of clock 104, which includes evaluation phases, 116 and 118. Consequently, dynamic node 108 undergoes two discharge-precharge cycles, 124 and 126. The output node similarly undergoes two discharge-precharge cycles, albeit with opposite phase, 124 and 126. Because the output is discharged during the precharge phase of dynamic node 108, even though the Boolean value of the logical function is "true" (that is, "high" in the embodiment of OR gate 100) the dynamic logic dissipates power even when the input signal states are unchanged.

Additionally, dynamic logic may be implemented in a dual rail embodiment in which all of the logic is duplicated, one gate for each sense of the data. That is, each logic element includes a gate to produce the output signal, and an additional gate to produce its complement. Such implementations may exacerbate the power dissipation in dynamic logic elements, as well as obviate the area advantages of dynamic logic embodiments.

Selection circuits, including shifting circuits and multiplexers, are used extensively within computer systems. Some of these selection circuits require multiple levels of selection, for example, a first input is selected from a plurality of first inputs wherein each of the first inputs are additionally selected from a plurality of second inputs. Computer systems employing dynamic logic may find that it is difficult to implement selection circuits for single and multilevel selection from many inputs because of the limitations of required precharge and evaluation times as well as the fact that outputs are not held during the precharge cycle.

Limited switching dynamic logic (LSDL) circuits produce circuits which mitigate the dynamic switching factor of dynamic logic gates with the addition of static logic devices which serve to isolate the dynamic node from the output node. Additionally, LSDL circuits and systems maintain the area advantage of dynamic logic over static circuits, and further provide both logic senses, that is, the output value and its complement.

Level Sensitive Scan Design (LSSD) methodology is well known to the prior art. Basically the LSSD methodology is a system design in which the device under test has a plurality of storage elements, i.e., latches or registers, that are concatenated in one or more scan chains and are externally accessible via one or more serial inputs and outputs. Storage elements that are not so concatenated are usually memory or other special macros that are isolated and can be tested independently. This LSSD methodology ensures that all logic feedback paths are gated by one or more of these concatenated storage elements, thereby simplifying a sequential design into subsets of combinational logic sections.

These basic design concepts, in conjunction with the associated system and scan clocking sequences, greatly simplify the test generation, testing, and the ability of diagnosing very complex logic structures. In such a design every latch can be used as a pseudo Primary Input (PI) and as a pseudo Primary Output (PO), in addition to the standard Primary Inputs and standard Primary Outputs, to enhance the stimulation and observability of the device being tested or diagnosed. Typically LSSD latches are implemented in a configuration having master (L1) and slave (L2) latches where each master latch (L1) has two data ports and may be updated be either a scan clock or a functional clock and each slave latch (L2) has but one clock input that is out of phase with both L1 scan and functional clocks. Scanning is done using separate A and B scan clocks.

The strategy of diagnosing these LSSD circuits has been established and evolving for many years. The primary characteristic of deterministic or pre-determined LSSD patterns is that each pattern is independent from every other pattern and each pattern consists of Primary Inputs, Clocks, a Load, and an Unload sequence. Such LSSD circuits may have thousands of patterns depending upon the size and structure of the logic. During diagnostics, one or more failing patterns are identified and fault simulation is performed on the failing pattern (Load, Primary Inputs, System Clocks, and Unload sequence). The circuit states can be quickly achieved by reviewing and simulating the falling pattern load, any Primary Inputs, System Clocks, and measures. Passing patterns may also be used to eliminate potential faults that the identified failing patterns marked as potential candidates.

However this method of diagnosing of such complex logic structures to determine the devices that have failed functional testing is very time consuming and difficult and is even more difficult when the circuit designs are sequential in nature and utilize a functional pattern test methodology as found in LSSD circuits. General Scan Designs (GSD) circuits are similar and well known to the art.

The testing and diagnosis of such complex circuits (LSSD and GSD) can be greatly simplified by adopting a design-for-test methodology that reduces the sequential circuit in partitions of combinational logic and allows access to the storage elements within the circuit during the testing process. This structural test methodology in conjunction with such scan based designs allows for effective functional and structural testing approaches.

Both, functional and structural logic test methodologies have unique advantages. Structural logic testing benefits include, ease of test pattern generation, simpler diagnostic methods, lower test pattern data volumes, specific fault targeting, high test coverage and precise test effectiveness measurement. Alternatively, functional testing can be applied at-speed, tests the actual device application functions, and closely emulates the operating environment during test. However, functional testing is sequential in nature and thus must rely on previous events or states of the logic for each subsequent pattern.

Functional fails are generally very difficult to diagnose since detail understanding of the logic circuit design and functional fail behavior is necessary and using the prior art techniques requires that test engineers and designers dedicate many hours and several diagnostic iterations to understand and diagnose the failure mechanism.

This basic problem complicates the diagnostic process by the need to track the structure's logical states for several previous events. This is required so that the failing vector can be analyzed with the proper values of each logic circuit at the time and point of failure.

Therefore, there are compelling economic reasons to electrically diagnose any fault in the circuit to within a couple of logic blocks or a dozen or so transistor devices as rapidly as possible. It is also desirable that the diagnostic process between the electrical model and the physical location be correlated by providing conventional physical failure analysis (PFA) tools with an precise physical location for the potential defect.

Therefore, there is a need for computing circuitry that combines front end dynamic logic circuits with a static latch circuit to achieve low power and high performance while incorporating features that are compatible with scanning architectures such as LSSD and GSD.

SUMMARY OF THE INVENTION

Scan latch circuitry is configured to have a front end comprising at least one dynamic logic gate that has a logic tree that performs the normal Boolean logic operation combined with scan circuitry that has a scan pull-down logic tree that is coupled to a scan hold latch output and to the dynamic node of the dynamic logic gate. A scan clock and a normal clock determine whether the scan latch circuitry is in the normal logic mode or in the scan test mode. A static output latch has at least one input that is responsive to a logic state of a dynamic node. The evaluated state of the dynamic node is set by either the logic tree of the dynamic logic gate or the scan pull-down logic tree of the scan circuitry in response to the logic state of the scan clock or the normal clock. The static output latch holds states of the evaluated dynamic node during the pre-charge phase of the scan clock and the normal clock. The output of the static latch may have individual buffers for driving a normal data path and the scan chain path.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings in which.

DETAILED DESCRIPTION

Figure 1A:
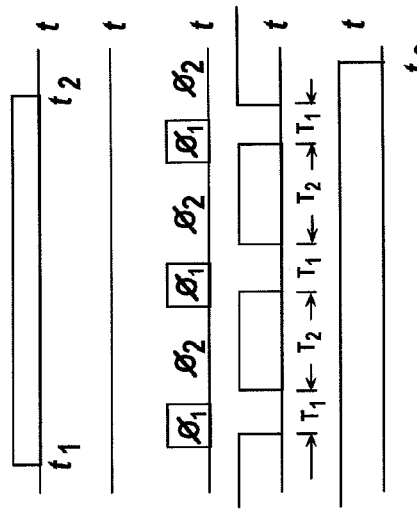
FIG. 1A is a prior art dynamic logic gate.

In the following description, numerous specific details are set forth to provide a thorough understanding of the present invention. For example, specific logic functions and the circuitry for generating them may be described; however, it would be recognized by those of ordinary skill in the art that the present invention may be practiced without such specific details. In other instances, well-known circuits have been shown in block diagram form in order not to obscure the present invention in unnecessary detail. Refer now to the drawings wherein depicted elements are not necessarily shown to scale and wherein like or similar elements are designated by the same reference numeral by the several views.

Figure 2D:
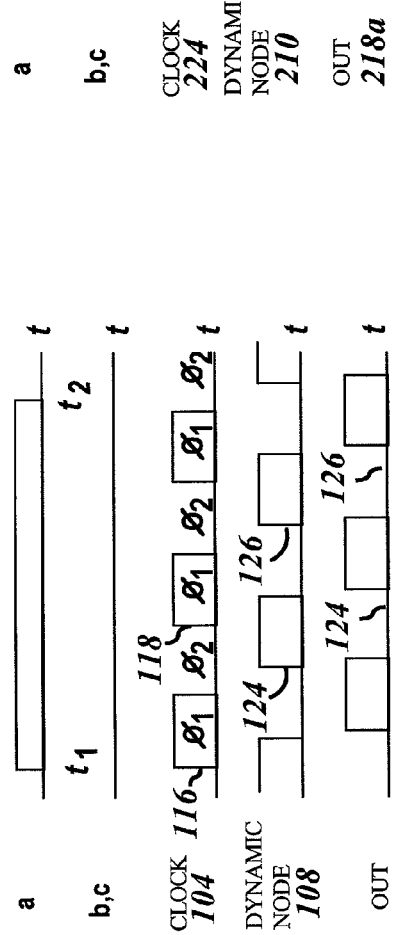
FIG. 2D illustrates a timing diagram corresponding to an embodiment of the dynamic logic device of FIG. 2A in which the logic function performed is the logical OR of three input signals.
Figure 2A:
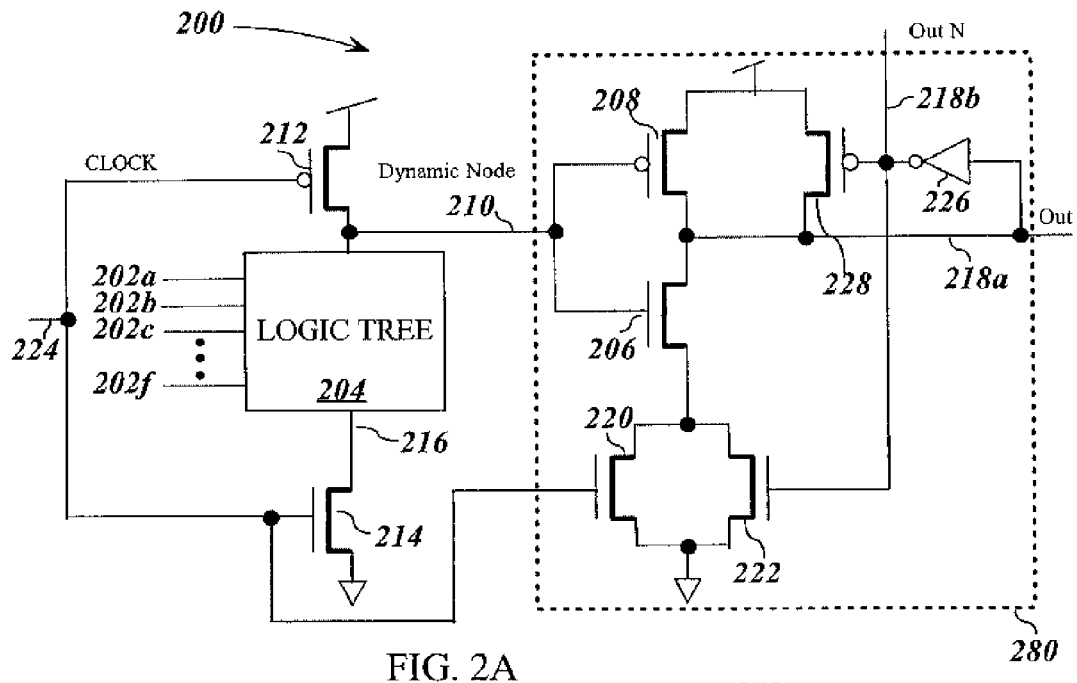
FIG. 2A illustrates, in partial schematic form, a standard LSDL device illustrating the static logic devices for isolating the dynamic node from the output node.

FIG. 2A illustrates a limited switch dynamic logic (LSDL) device 200 suitable for use in embodiments of the present inventive principles. In general, LSDL device 200 receives a plurality, n, of inputs 202a . . . 202d provided to logic tree 204, and outputs a Boolean combination of the inputs. The particular Boolean function performed by LSDL device 200 is reflected in the implementation of logic tree 204 (accounting for the inversion performed by the inverter formed by n-channel field effect transistor (NFET) 206 and p-channel field effect transistor (PFET) 208). Logic tree 204 is coupled between the drain of PFET 212 and the drain of NFET 214, node 216. The junction of the logic tree 204 and the drain of PFET 212 forms dynamic node 210.

Figure 2B:
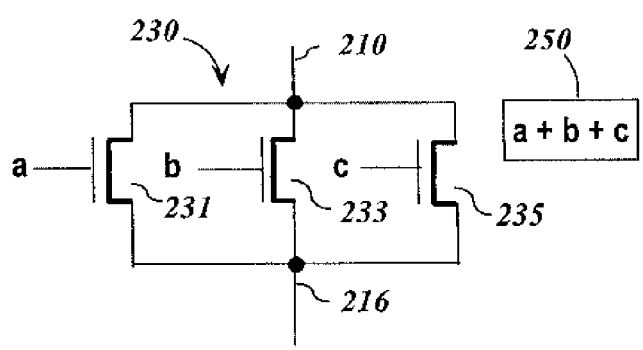
FIG. 2B illustrates, in partial schematic form, circuitry for incorporation in the logic tree of FIG. 2A whereby the logic function performed is the logical OR of three input signals.
Figure 2C:
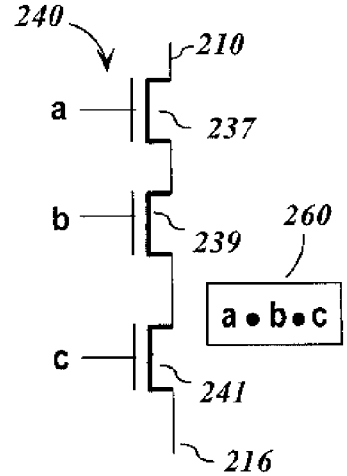
FIG. 2C illustrates, in partial schematic form, another circuit for incorporation in the logic tree of FIG. 2A whereby the logic function performed is the logical AND of three input signals.

For example, FIG. 2B illustrates logic tree 230 including three parallel connected NFETs, 231, 233 and 235. Logic tree 230 may be used to provide a logic device generating the logical NOR of the three input signals coupled to corresponding ones of the gates of NFETs 231, 233 and 235, a, b and c (as indicated by the Boolean expression 250 in FIG. 2B) and accounting for the inversion via NFET 206 and PFET 208. Similarly, FIG. 2C illustrates a logic tree 240 including tree serially connected NFETs 237, 239 and 241. Logic tree 240 may be used in conjunction with the logic device 200 to generate the logical NAND of the three input signals a, b and c (as indicated by the Boolean expression 260 in FIG. 2C).

Returning to FIG. 2B, dynamic node 210 is coupled to the common junction of the gates of NFET 206 and PFET 208 which invert the signal on dynamic node 210. The inversion of the signal on dynamic node 210 is provided on Out 218a. The transistor pair, 206 and 208, is serially coupled to parallel NFETs 220 and 222. NFET 220 is switched by clock signal 224. Thus, during the evaluate phase of clock signal 224, the inverter pair, NFET 206 and PFET 208 are coupled between the supply rails by the action of NFET 220.

Figure 1B:
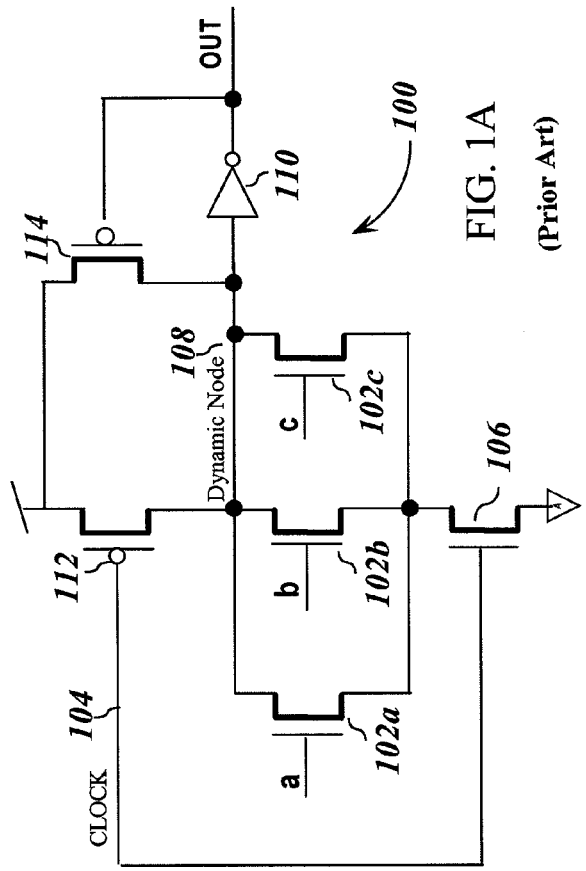
FIG. 1B is the timing diagram for the dynamic logic gate of FIG. 1A

The operation of LSDL device 200 during the evaluate phase, $N_1$, may be further understood by referring to FIG. 2D illustrating an exemplary timing diagram corresponding to the dynamic logic circuit of FIG. 2A in combination with a logic tree embodiment 230 of FIG. 2B. In this way, for purposes of illustration, the timing diagram in FIG. 2D is the counterpart to the timing diagram in FIG. 1B for the three-input OR gate 100 depicted in FIG. 1A. As shown, input a is "high" or "true" between $t_1$ and $t_2$. In the evaluate phase, $N_1$ of clock signal 224, dynamic node 210 is pulled down (intervals $T_1$). In these intervals, Out 218a is held high by the action of the inverter formed by transistors 206 and 208, which inverter is active through the action of NFET 220 as previously described. In the intervening intervals, $T_2$, dynamic node 210 is pulled up via the action of the precharge phase, $N_2$ of clock signal 224, and PFET 212. In these intervals, the inverter is inactive as NFET 220 is off Out 218a is held "high" by the action of inverter 226 and PFET 228. Note also that the output of inverter 226 may provide a complementary output, Out N 218b. (Thus, with respect to the three-input logic trees in FIGS. 2B and 2C, the corresponding logic device represents a three-input OR gate and a three-input AND gate, respectively.)

Returning to FIG. 2A, if the logic tree evaluates "high", that is the Boolean combination of inputs 202a . . . 202d represented by logic tree 204, evaluate high, whereby dynamic node 210 maintains its precharge, Out 218a is discharged via NFET 206 and NFET 220. In the subsequent precharge phase, $N_2$, of clock signal 224, Out 218a is latched via the action of inverter 226 and NFET 222. Thus, referring again to FIG. 2D, corresponding to the three input OR embodiment of logic device 200 and logic tree 230 (FIG. 2B) at $t_2$ input a falls, and in the succeeding evaluate phase of clock signal 224, dynamic node 210 is held high by the precharge. The inverter pair, NFETs 206 and 208, are active in the evaluate phase of $N_1$, of clock signal 224 because of the action of NFET 220. Consequently, Out 218a falls ($t_3$). In the succeeding precharge phase, $N_2$ of clock signal 224, Out 218a is latched in the "low" state, as previously described.

In this way, LSDL device 200 in FIG. 2A, may provide a static switching factor on Out 218a, and likewise with respect to the complementary output Out N 218b. Note too, as illustrated in the exemplary timing diagram in FIG. 2D, the duty factor of the clock signal may have a value that is less than fifty percent (50%). In such an embodiment, the evaluate phase, $N_1$, of the clock signal may be shorter in duration than the precharge phase, $N_2$. A clock signal having a duty factor less than fifty percent (50%) may be referred to as a pulse (or pulsed) clock signal. A width of the evaluate phase may be sufficiently short that leakage from the dynamic node may be inconsequential. That is, leakage does not affect the evaluation of the node.

In such a clock signal embodiment, the size of the precharge device (PFET 212 in the embodiment of FIG. 2A) may be reduced. It would be recognized by those of ordinary skill in the art that a symmetric clock signal has a fifty percent (50%) duty cycle; in an embodiment in which the duty cycle of the clock signal is less than fifty percent (50%), the size of the precharge device may be reduced concomitantly. In particular, an embodiment of the present invention may be implemented with a clock signal duty cycle of approximately thirty percent (30%). Additionally, while logic device 200 has been described from the perspective of "positive" logic, alternative embodiments may be implemented in the context of "negative" logic.

Figure 3:
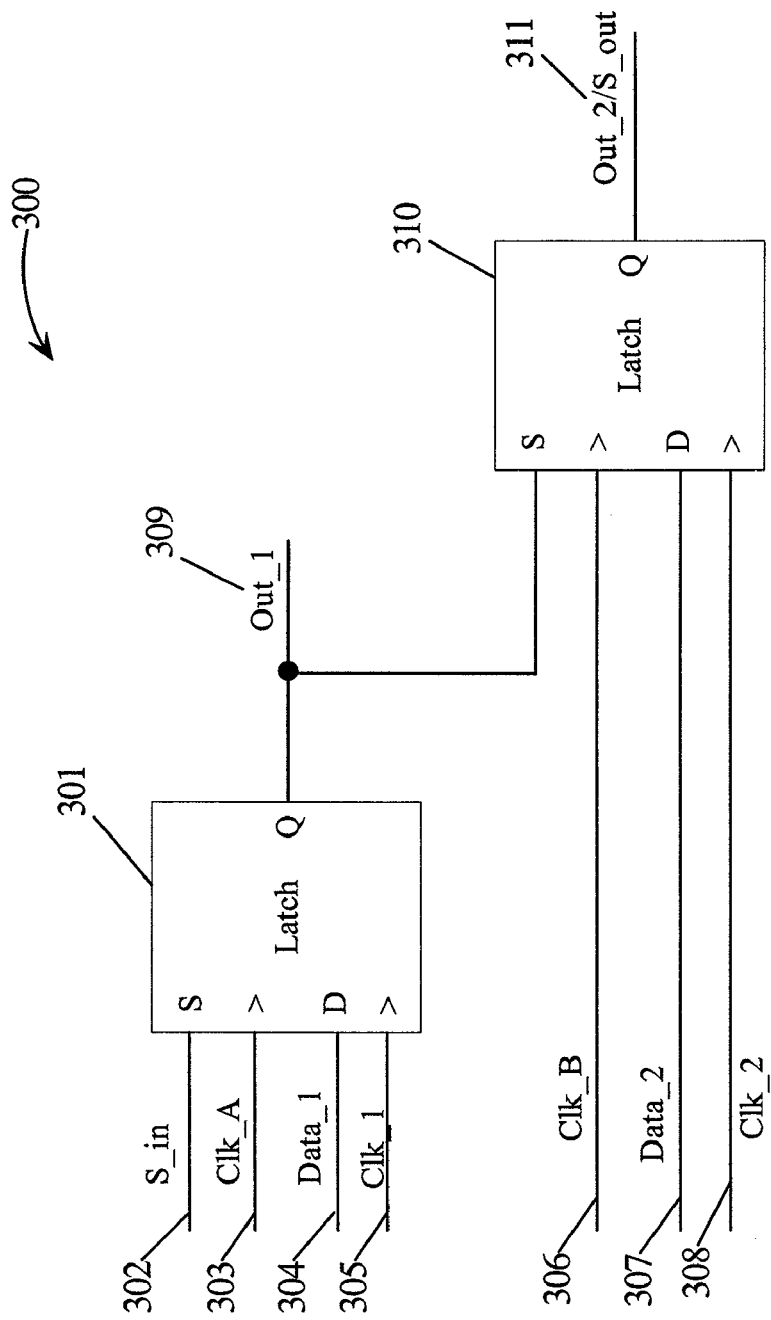
FIG. 3 is a block diagram of a LSSD scan latches.

FIG. 3 is a prior art block diagram of a latch configuration used in level sensitive scan design (LSSD). LSSD is a type of scan design that uses separate system clocks Clk_1 305 and Clk_2 308 and non-overlapping scan clocks Clk_A 303 and Clk_B 306. The scan latch configuration of FIG. 3 allows latch 301 and latch 310 to be used for system latches in the normal mode and master/slave scan latches in the scan mode. Output 309 is a system output and output 311 is either a scan output or a system output depending on the state of the scan clocks. An exemplary operation would force the normal mode when both scan clocks Clk_A 303 and Clk_B 306 are held in a logic zero state and cause the scan data (S_in 302) to be latched when the scan clocks Clk_A 303 and Clk_B 306 are pulsed to a logic one during the scan mode. When in the normal mode, Data_1 304 is latched to Out_1 309 with Clk_1 305 and Data_2 307 is latched to Out_2 311 with Clk_2 308.

Figure 4A:
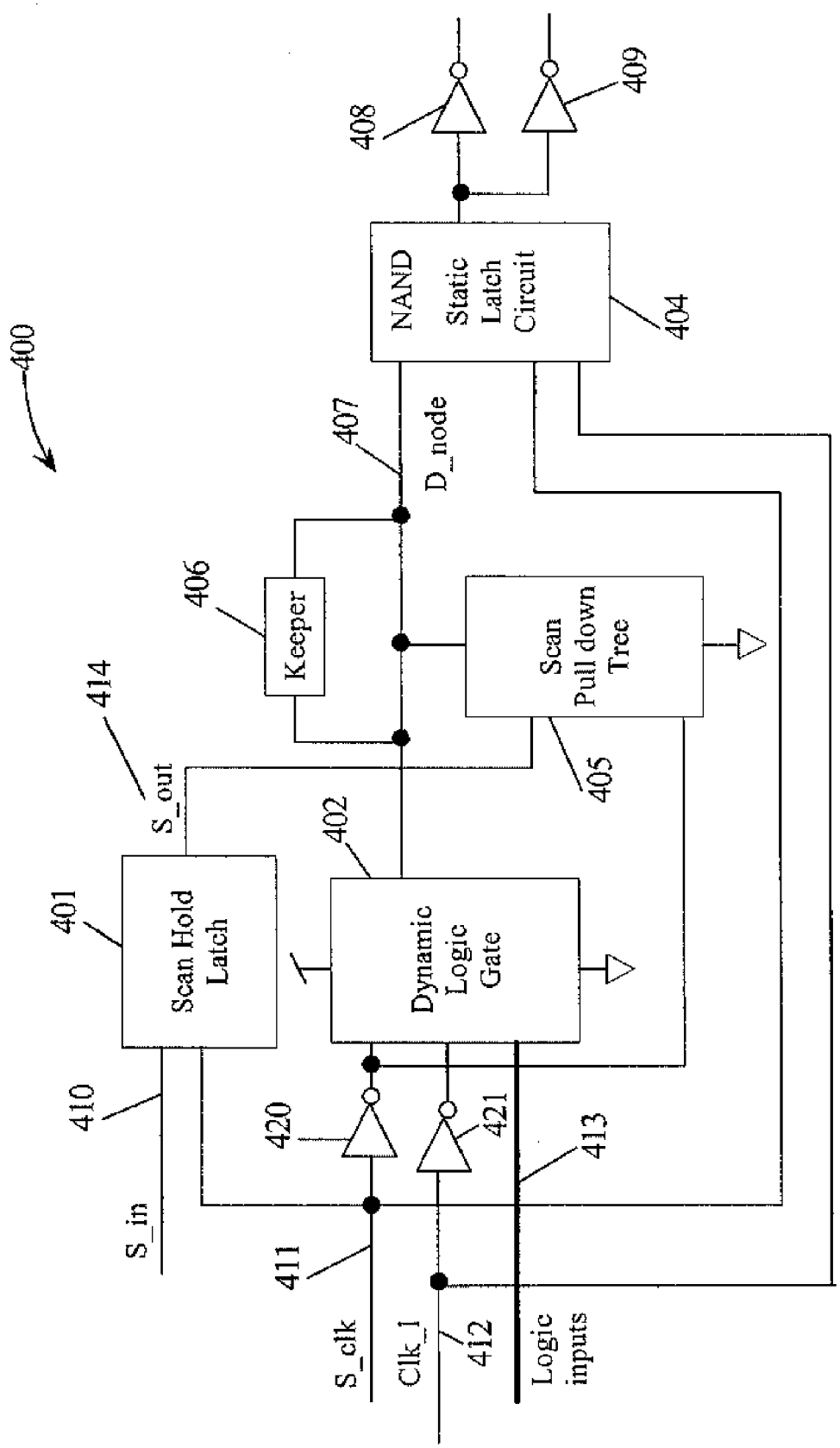
FIG. 4A is a circuit block diagram of a scannable latch according to embodiments of the present invention.

FIG. 4A is a block diagram of a scannable latch circuit 400 according to an embodiment of the present invention. Scannable latch circuit 400 comprises a scan hold latch 401, a dynamic logic gate 401, a scan pull-down tree 405 and a NAND static latch circuit 404. The operation of scannable latch circuit 400 is controlled by scan clock S_clk 411 and system clock Clk_1 412. For normal operation, S_clk 411 is held to a logic one state while Clk_1 412 alternates logic states. During the scan operation, Clk_1 412 is held to a logic one state while S_clk 411 alternates logic states. Scan data is coupled to S_in 410 of scan hold latch 401. The latched scan data is coupled from scan output S_out 414 to the input of scan pull-down tree 405. Scan pull-down tree 405 is gated OFF when S_clk 411 is a logic one so scan pull-down tree 405 has not affect on dynamic node D_node 407 during normal operation. D_node 407 is pre-charged to a logic one when both S_clk 411 and Clk_1 412 are a logic one. In the normal mode, S_clk 411 remains a logic one and the Boolean combination of logic inputs 413 are evaluated when Clk_1 412 transitions to a logic zero. The pre-charge state of D_node 407 is held by keeper 406 to improve noise immunity. When Clk_1 412 transitions to a logic zero the logic state of D_node 407 is latched by static latch 404. Inverter buffers 408 and 409 provide separate drive for a logic path and a scan path.

In the scan mode, the static logic one state of Clk_1 412 gates dynamic logic gate 402 OFF preventing it from evaluating D_node 407. During the pre-charge phase, scan hold latch 401 latches the logic state of S_in 410 which is coupled to S_out 414 and to scan pull-down tree 405. When S_clk 411 transitions to a logic zero, D_node 407 evaluates to the logic state of S_out 414. When S_clk 411 transitions to a logic one, static latch 404 latches the scan data. In this manner, a single static latch 404 may be used as either a system latch or a scan latch while having an input responsive to the Boolean combination of logic signals in a dynamic logic gate thus improving performance.

Figure 4B:
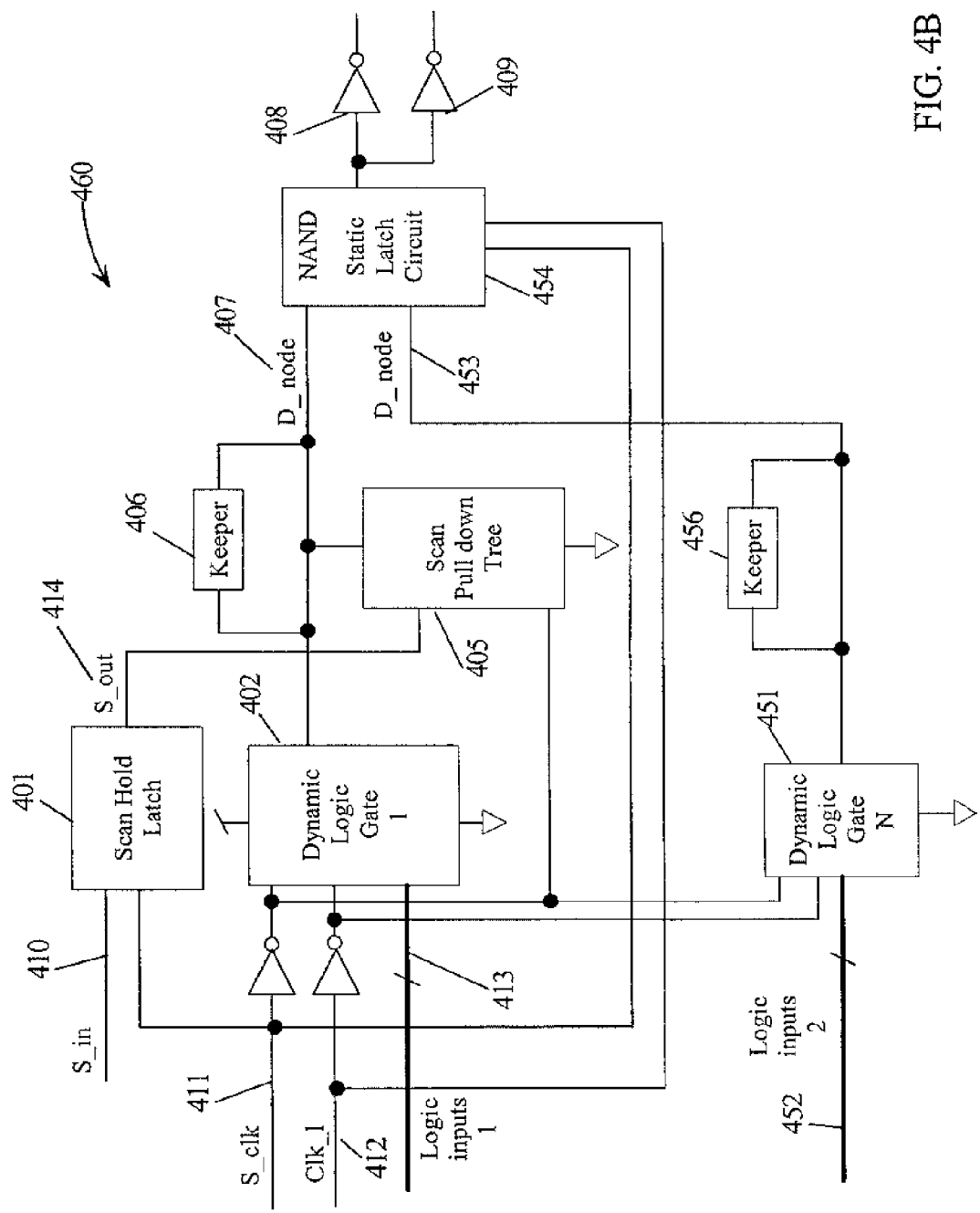
FIG. 4B is a circuit block diagram of a scannable latch according to another embodiment of the present invention.

FIG. 4B is a block diagram of a scannable latch circuit 460 according to another embodiment of the present invention. In this embodiment, the NAND static latch 454 comprises circuitry that accepts a plurality of dynamic nodes D_node 407 and D_node 453 from dynamic logic gates 402 and 451, respectively, that are responsive to logic inputs_1 413 and logic inputs_2 452. Either one of the dynamic nodes D_node 407 or D_node 453 may be coupled to the scan pull-down tree 405. In this manner, more complex logic functions are possible while maintaining the feature of a single output latch that serves the system logic function and a test scan function.

The operation of scannable latch circuit 460 is similar to latch circuit 400 and is controlled by scan clock S_clk 411 and system clock Clk_1 412. For normal operation, S_clk 411 is held to a logic one state while Clk_1 412 alternates logic states. During the scan operation, Clk_1 412 is held to a logic one state while S_clk 411 alternates logic states. Scan data is coupled to S_in 410 of scan hold latch 401. The latched scan data is coupled from scan output S_out 414 to the input of scan pull-down tree 405. Scan pull-down tree 405 is gated OFF when S_clk 411 is a logic one so scan pull-down tree 405 has no affect on dynamic node D_node 407. D_node 407 is pre-charged to a logic one when both S_elk 411 and Clk_1 412 are a logic one. In the normal mode, S_elk 411 remains a logic one and the Boolean combination of logic inputs 413 and 452 are evaluated at D_node 407 and D_node 453, respectively, when Clk_1 412 transitions to a logic zero. The pre-charge state of D_node 407 and D_node 453 are held by keepers 406 and 456, respectively, to improve noise immunity. When Clk_1 412 transitions to a logic zero the AND of the logic states of D_node 407 and D_node 453 are latched by static latch 454. Inverter buffers 408 and 409 provide separate drive for a logic path and a scan path.

In the scan mode, the static logic one state of Clk_1 412 gates dynamic logic gates 402 and 451 OFF preventing them from evaluating D_node 407 and D_node 453. During the pre-charge phase, scan hold latch 401 latches the logic state of S_in 410 which is coupled to S_out 414 and to scan pull-down tree 405. When S_clk 411 transitions to a logic zero, D_node 407 evaluates to the logic state S_out 414. When S_clk 411 transitions to a logic one, static latch 404 latches the scan data. The output of dynamic logic gate 451 remains in its pre-charge logic one state and does not affect the operation of static latch circuitry 454. In this manner, a single static latch 454 may be used as either a complex system latch or a scan latch maintaining the speed of dynamic logic.

Figure 4C:
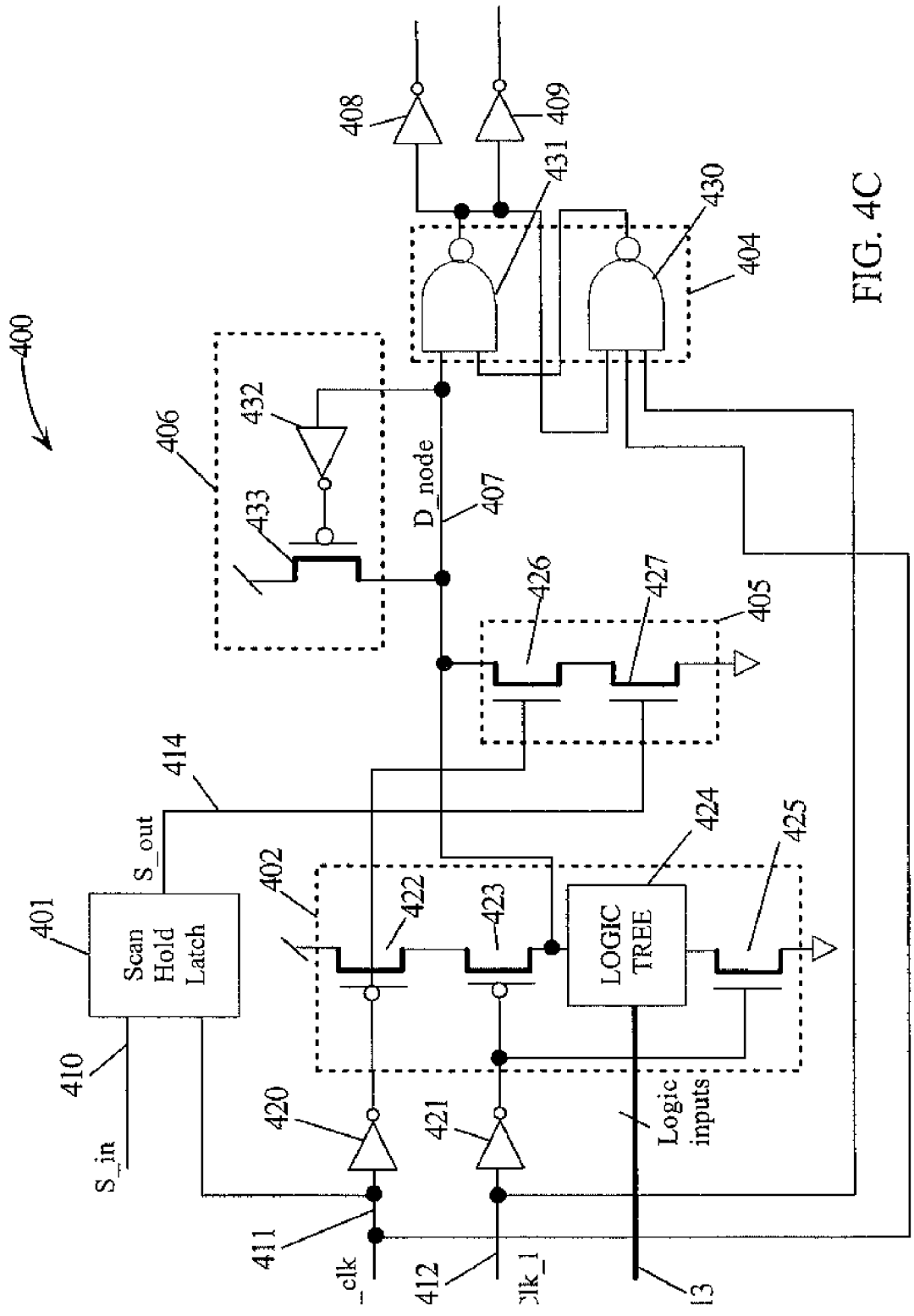
FIG. 4C is a circuit and block diagram of the scannable latch in FIG. 4A.

FIG. 4C is a circuit detail and block diagram of scannable latch circuit 400 according to another embodiment of the present invention. The detail of scan hold latch 401 is presented in a later drawing. S_in 410 is latched to S_out 414 of scan hold latch 401 when S_clk 411 transitions to a logic zero. Dynamic logic gate 402 comprises series coupled PFETs 422 and 423 which pre-charge D_node 407 when both S_Clk 411 and Clk 412 are a logic one and logic tree 424 is de-coupled from evaluating D_node 407 by NFET 425 when Clk 412 is a logic one. The scan pull-down tree 405 comprises the series connection of NFETs 426 and 427. The logic state of S_out 414 is evaluated at D_node 407 when S_clk 411 transitions to a logic zero. Keeper 406 comprises a PFET 433 and inverter 432. The logic one pre-charge state of D_node 407 is latched by keeper 406 to improve noise immunity. NAND latch 404 comprises two NAND logic gates; NAND gate 431 has two inputs and NAND gate 430 has three inputs. During the pre-charge phase, both S_clk 411 and Clk 412 are a logic one which enables NAND gate 430 and latches the evaluated state of D_node 407.

During evaluation, either S_clk 411 or Clk 412 transitions to a logic zero and the output of NAND gate 430 transitions to a logic one enabling NAND gate 431 whose output is response to the logic NAND combination of the inputs. If the output of NAND 431 evaluates to a logic one, then two of the three inputs to NAND 430 are a logic one prior to the pre-charge phase. When the alternating clock signal (either S_clk 411 or Clk 412) transition to a logic one, then the output of NAND 430 will transition to a logic zero latching the logic one at the output of NAND 431.

If the output of NAND 431 evaluates to a logic zero, then the D_node 407 remains at is pre-charge logic one state. When the alternating clock signal (either S_clk 411 or Clk 412) transition to a logic one, then the output of NAND 430 remain a logic one zero as the output state of NAND gate 430 remains a logic one.

Figure 5:
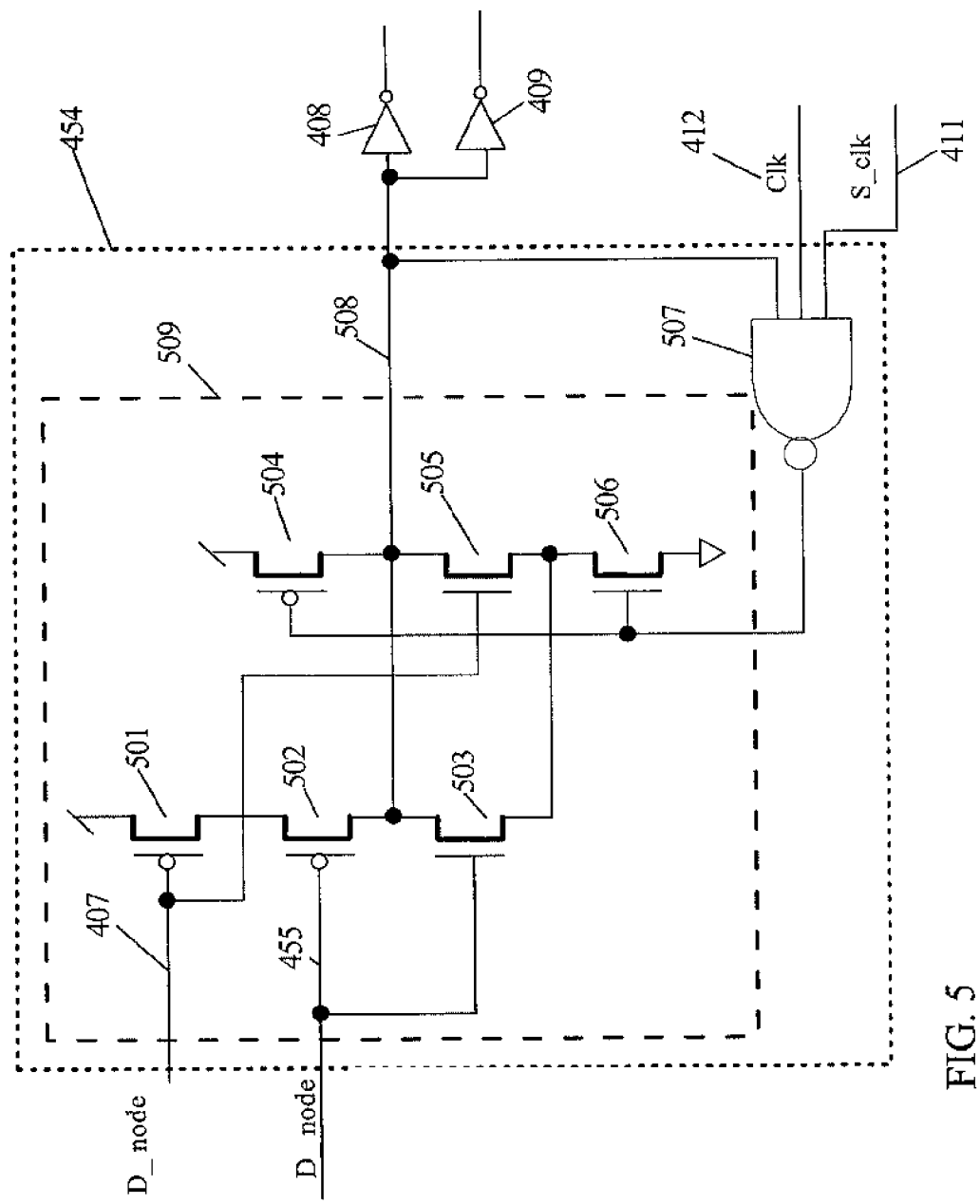
FIG. 5 is a circuit diagram of the static latch of FIG. 4B.

FIG. 5 is a circuit diagram of NAND latch 454 according to another embodiment of the present invention. The front end circuitry comprising PFETs 501-503 and NFETs 503-506 are configured as a NOR circuit 509 relative to output 508. During the pre-charge phase, both Clk 412 and S_clk 411 are a logic one turning ON both NFETs 503 and 505. If output 508 is a logic zero, then output of NAND 507 is a logic one turning ON NFET 506, therefore, output 508 remains a logic zero. If output 508 is a logic one, then output of NAND 507 transitions to a logic zero turning OFF NFET 506, therefore, output 508 remains a logic one. When either Clk 412 or S_clk 411 transition to logic zero during the evaluation phase, the output of NAND 507 will transition to a logic one. If both D_node 407 and D_node 455 evaluate to a logic zero, then output 508 will transition to a logic one or remain at a logic one. If either D_node 407 and D_node 455 evaluate to a logic one, then output 508 will transition to a logic zero or remain at a logic zero. The scan pull-down logic tree may be coupled to either D_node 407 or D_node 455.

Figure 6:
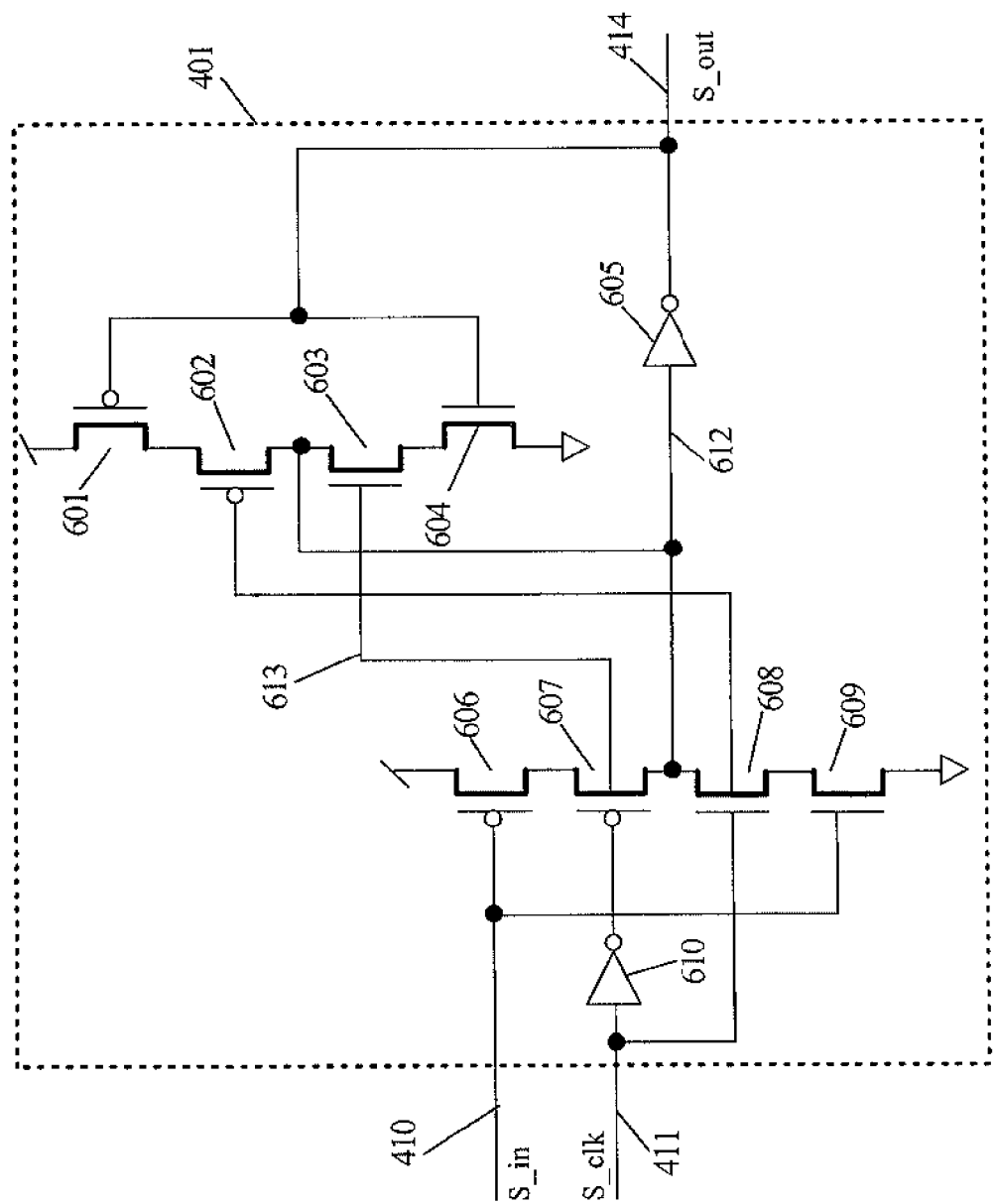
FIG. 6 is a circuit diagram of the scan hold latch used in FIG. 4A according to embodiments of the present invention.

FIG. 6 is a detailed circuit diagram of a scan hold latch according to another embodiment of the present invention. PFETs 606 and 607 and NFETs 608 and 609 are configured as a first gated inverter wherein a logic state at S_in 410 is inverted to output 612 when S_clk is a logic one and isolated from output 612 when S_clk is a logic zero. PFETs 601 and 602 and NFETs 603 and 604 are likewise configured as a second gated inverter wherein a logic state at S_out 414 is inverted back to output 612 when S_clk is a logic zero and isolated from output 612 when S_clk is a logic one. Therefore, during the pre-charge phase, when S_elk 411 is a logic one the logic state of S_in 410 is coupled to S_out 414. During the evaluate phase, the first gated inverter is gated OFF and the second gated inverter is gated ON. The second gated inverter and inverter 605 form latch and hold the logic state of S_out 414. The logic state of S_out 414 is asserted to evaluate the dynamic node during scan mode.

Figure 7:
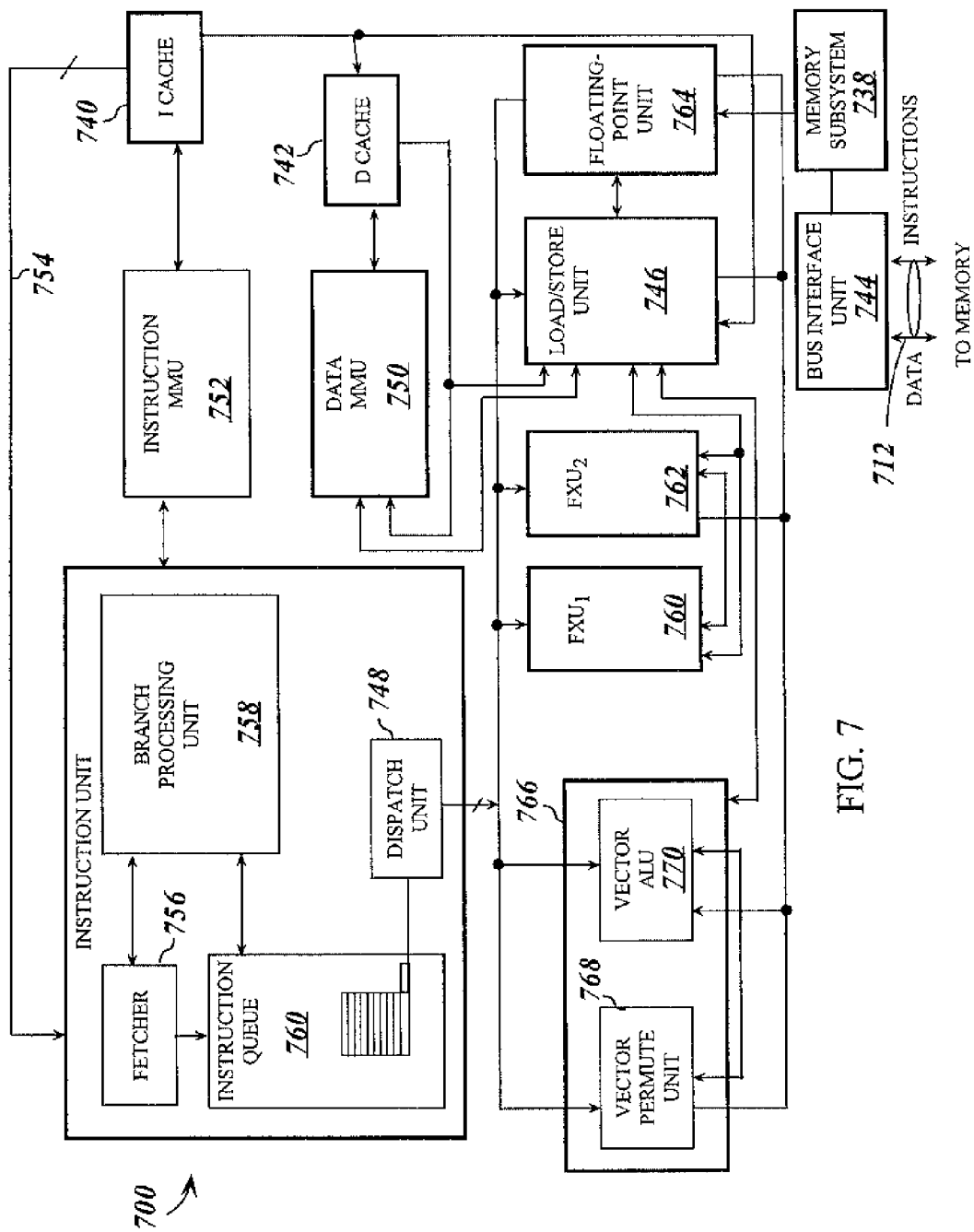
FIG. 7 illustrates a high level block diagram of selected operational blocks within a central processing unit (CPU) incorporating the present inventive principles.

FIG. 7 is a high level functional block diagram of selected operational blocks that may be included in a central processing unit (CPU) 700. In the illustrated embodiment, CPU 700 includes internal instruction cache (I-cache) 740 and data cache (D-cache) 742 which are accessible to memory (not shown in FIG. 7) through bus 712, bus interface unit 744, memory subsystem 738, load/store unit 746 and corresponding memory management units: data MMU 750 and instruction MMU 752. In the depicted architecture, CPU 700 operates on data in response to instructions retrieved from I-cache 740 through instruction dispatch unit 748. Dispatch unit 748 may be included in instruction unit 754 which may also incorporate fetch unit 756 and branch processing unit 758 which controls instruction branching. An instruction queue 760 may interface fetch unit 756 and dispatch unit 748. In response to dispatched instructions, data retrieved from D-cache 742 by load/store unit 746 can be operated upon by one of fixed point unit (FXU) 760, FXU 762 or floating point execution unit (FPU) 764. Additionally, CPU 700 provides for parallel processing of multiple data items via vector execution unit (VXU) 766. VXU 766 includes vector permute unit 768 which performs permutation operations on vector operands, and vector arithmetic logic unit (VALU) 770 which performs vector arithmetic operations, which may include both fixed-point and floating-point operations on vector operands. CPU 700 may have scannable latches configured according to embodiments of the present invention to improve overall processor performance.

Figure 8:
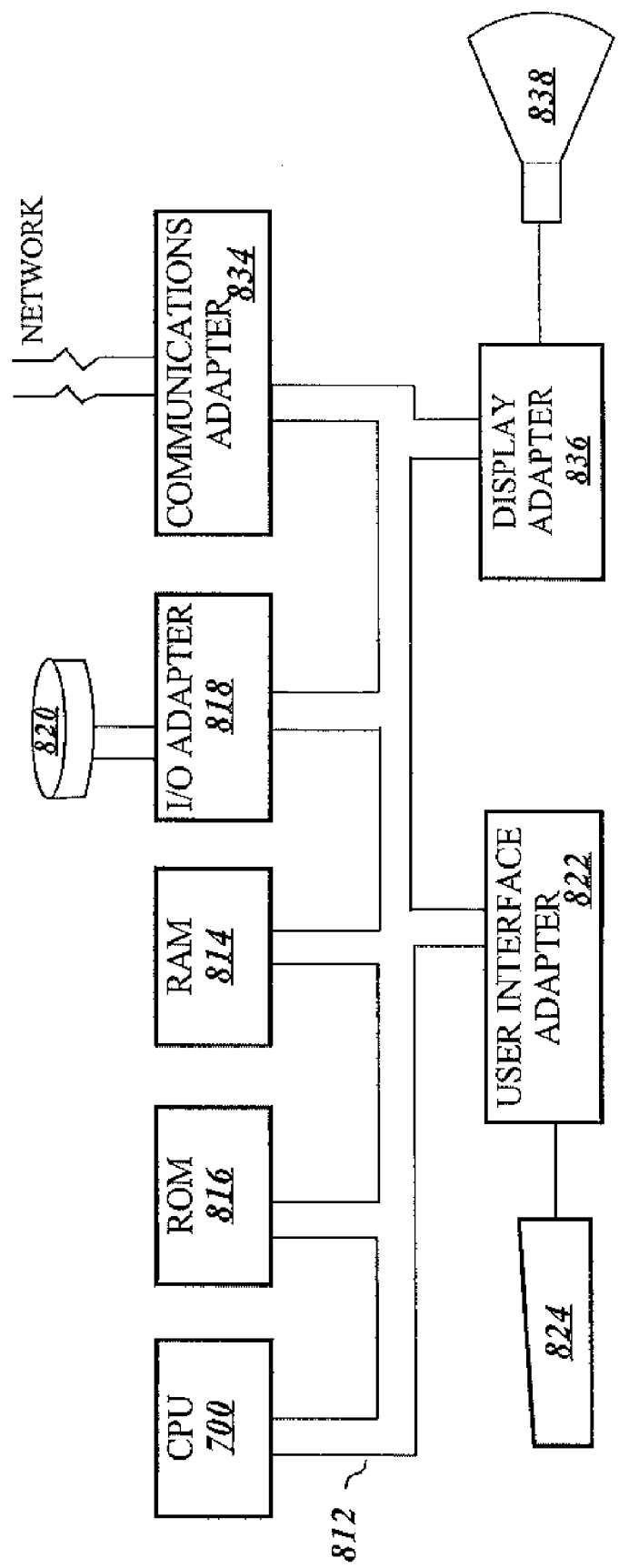
FIG. 8 illustrates a data processing system incorporating a CPU according to the present inventive principles.

A representative hardware environment 800 for practicing the present invention is depicted in FIG. 8, which illustrates a typical hardware configuration of a data processing system in accordance with the subject invention having CPU 700, incorporating scannable latches according to the present inventive principles, and a number of other units interconnected via system bus 812. The data processing system shown in FIG. 8 includes random access memory (RAM) 814, read only memory (ROM) 816, and input/output (I/O) adapter 818 for connecting peripheral devices such as disk units 820 to bus 812, user interface adapter 822 for connecting keyboard 824, mouse 826, and/or other user interface devices such as a touch screen device (not shown) to bus 812, communication adapter 834 for connecting the system to a data processing network, and display adapter 836 for connecting bus 812 to display device 838. Note that CPU 800 may reside on a single integrated circuit.

Although the present invention and its advantages have been described in detail, it should be understood that various changes, substitutions and alterations can be made herein without departing from the spirit and scope of the invention as defined by the appended claims.

What is claimed is:

1. A scannable latch circuit comprising:
  a first dynamic logic gate having a first clock input coupled to a data clock signal, a second clock input coupled to a scan clock signal, and an output coupled to a first dynamic node, wherein the first dynamic node is pre-charged to a first logic state when both the data clock signal and the scan clock signal have the first logic state and the first dynamic node is evaluated by a logic tree to a first Boolean combination of a plurality of first logic signals when the data clock signal is has a second logic state and the scan clock signal has the first logic state;
  a scan latch circuit having an input coupled to a scan input signal and a scan output, wherein a logic state of the scan input signal is coupled to the scan output when the scan clock signal has the first logic state and a logic state of the scan output is latched when the scan clock has the second logic state;
  a scan pull-down tree having a first input coupled to the scan output a second input coupled to the scan clock, and an output node coupled to the first dynamic node, wherein the scan pull-down tree evaluates the first dynamic node to a logic state in response to a logic state of the scan output when the scan clock has the second logic state; and
  a static latch having a first input coupled to the first dynamic node, a second input coupled to the scan clock signal, a third input coupled to the data clock signal, a latch output coupled to a scan path and a data path, wherein a logic state is set to the latch output in response to a logic state of the first dynamic node when either the scan clock or the data clock transition to the second logic state and the logic state of latch output is held when both the scan clock and the data clock have the first logic state.

2. The scannable latch circuit of claim 1 further comprising:
  a second dynamic logic gate having a first clock input coupled to the data clock signal, a second clock input coupled to the scan clock signal, and an output coupled to a second dynamic node, wherein the second dynamic node is pre-charged to the first logic state when both the data clock signal and the scan clock signal have the first logic state and the second dynamic node is evaluated by a logic tree to a second Boolean combination of a plurality of second logic signals when the data clock signal has the second logic state and the scan clock signal has the first logic state.

3. The scannable latch circuit of claim 2, wherein the static latch has a fourth input coupled to the second dynamic node and a logic state is set to the latch output in response to a third Boolean combination of evaluated logic states of the first dynamic node and the second dynamic node when either the scan clock or the data clock transition to the second logic state and the logic state of latch output is held when both the scan clock and the data clock have the first logic state.

4. The scannable latch circuit of claim 3, wherein the latch output is coupled to the scan path with a first buffer circuit and the latch output is coupled to the data path with a second buffer circuit isolating the scan path and the data path.

5. The scannable latch circuit of claim 1 further comprising a keeper circuit having an input and output coupled to the first dynamic node, wherein an output of the keeper circuit is regenerative and holds the first logic state of the first dynamic node during the pre-charge phase of the first dynamic node and the output of the keeper circuit is decoupled from the first dynamic node during the evaluate phase of the first dynamic node.

6. The scannable latch circuit of claim 2 further comprising a keeper circuit having an input and output coupled to the second dynamic node, wherein an output of the keeper circuit is regenerative and holds the first logic state of the second dynamic node during the pre-charge phase of the second dynamic node and the output of the keeper circuit is decoupled from the second dynamic node during the evaluate phase of the second dynamic node.

7. The scannable latch circuit of claim 1, wherein the static latch comprises:
   a first static logic gate having the second input of the static latch coupled to the scan clock signal, the third input of the static latch coupled to the data clock signal and a first logic input coupled to the latch output of the static latch and a logic output; and
   a second static logic gate having the first input of the static latch coupled to the first dynamic node, a second logic input coupled to the logic output of the first static logic gate, and a logic output coupled as the latch output of the static latch.

8. The scannable latch circuit of claim 3, wherein the static latch comprises:
   a first static logic gate having the second input of the static latch coupled to the scan clock signal, the third input of the static latch coupled to the data clock signal, and a first logic input coupled to the latch output of the static latch and a logic output; and
   a second static logic gate having the first input of the static latch coupled to the first dynamic node, the fourth input coupled to the second dynamic node, a second logic input coupled to the logic output of the first static logic gate, and a logic output coupled as the latch output of the static latch.

9. The scannable latch circuit of claim 7, wherein the first and second static logic gates have a NAND functionality.

10. The scannable latch circuit of claim 8, wherein the first static logic gate a NAND functionality and the second logic gate has a NOR functionality.

11. A central processing unit (CPU) comprising:
   digital processing circuitry for processing digital data; and
   a memory for storing data and program instructions, wherein the digital processing circuitry has at least one scannable latch circuit having a first dynamic logic gate with a first clock input coupled to a data clock signal, a second clock input coupled to a scan clock signal, and an output coupled to a first dynamic node, wherein the first dynamic node is pre-charged to a first logic state when both the data clock signal and the scan clock signal have the first logic state and the first dynamic node is evaluated by a logic tree to a first Boolean combination of a plurality of first logic signals when the data clock signal is has a second logic state and the scan clock signal has the first logic state, a scan latch circuit having an input coupled to a scan input signal and a scan output, wherein a logic state of the scan input signal is coupled to the scan output when the scan clock signal has the first logic state and a logic state of the scan output is latched when the scan clock has the second logic state, a scan pull-down tree having a first input coupled to the scan output a second input coupled to the scan clock, and an output node coupled to the first dynamic node, wherein the scan pull-down tree evaluates the first dynamic node to a logic state in response to a logic state of the scan output when the scan clock has the second logic state, and a static latch having a first input coupled to the first dynamic node, a second input coupled to the scan clock signal, a third input coupled to the data clock signal, a latch output coupled to a scan path and a data path, wherein a logic state is set to the latch output in response to a logic state of the first dynamic node when either the scan clock or the data clock transition to the second logic state and the logic state of latch output is held when both the scan clock and the data clock have the first logic state.

12. The CPU of claim 11 further comprising:
   a second dynamic logic gate having a first clock input coupled to the data clock signal, a second clock input coupled to the scan clock signal, and an output coupled to a second dynamic node, wherein the second dynamic node is pre-charged to the first logic state when both the data clock signal and the scan clock signal have the first logic state and the second dynamic node is evaluated by a logic tree to a second Boolean combination of a plurality of second logic signals when the data clock signal has the second logic state and the scan clock signal has the first logic state.

13. The CPU of claim 12, wherein the static latch has a fourth input coupled to the second dynamic node and a logic state is set to the latch output in response to a third Boolean combination of evaluated logic states of the first dynamic node and the second dynamic node when either the scan clock or the data clock transition to the second logic state and the logic state of latch output is held when both the scan clock and the data clock have the first logic state.

14. The CPU of claim 13, wherein the latch output is coupled to the scan path with a first buffer circuit and the latch output is coupled to the data path with a second buffer circuit isolating the scan path and the data path.

15. The CPU of claim 11 further comprising a keeper circuit having an input and output coupled to the first dynamic node, wherein an output of the keeper circuit is regenerative and holds the first logic state of the first dynamic node during the pre-charge phase of the first dynamic node and the output of the keeper circuit is decoupled from the first dynamic node during the evaluate phase of the first dynamic node.

16. The CPU of claim 12 further comprising a keeper circuit having an input and output coupled to the second dynamic node, wherein an output of the keeper circuit is regenerative and holds the first logic state of the second dynamic node during the pre-charge phase of the second dynamic node and the output of the keeper circuit is decoupled from the second dynamic node during the evaluate phase of the second dynamic node.

17. The CPU of claim 11, wherein the static latch comprises:
   a first static logic gate having the second input of the static latch coupled to the scan clock signal, the third input of the static latch coupled to the data clock signal and a first logic input coupled to the latch output of the static latch and a logic output; and
   a second static logic gate having the first input of the static latch coupled to the first dynamic node, a second logic input coupled to the logic output of the first static logic gate, and a logic output coupled as the latch output of the static latch.

18. The CPU of claim 13, wherein the static latch comprises:
   a first static logic gate having the second input of the static latch coupled to the scan clock signal, the third input of the static latch coupled to the data clock signal, and a first logic input coupled to the latch output of the static latch and a logic output; and
   a second static logic gate having the first input of the static latch coupled to the first dynamic node, the fourth input coupled to the second dynamic node, a second logic input coupled to the logic output of the first static logic gate, and a logic output coupled as the latch output of the static latch.

19. The CPU of claim 17, wherein the first and second static logic gates have a NAND functionality.

20. The CPU of claim 18, wherein the first static logic gate a NAND functionality and the second logic gate has a NOR functionality.

* * * * *